United States Patent [19]
Ogita et al.

[11] 4,178,551
[45] Dec. 11, 1979

[54] BANDWIDTH SWITCHING CIRCUITS OF RADIO RECEIVER

[75] Inventors: Minoru Ogita; Yuzo Ishigaki, both of Hamamatsu, Japan

[73] Assignee: Nippon Gakki Seizo Kabushiki Kaisha, Shizuoka, Japan

[21] Appl. No.: 850,310

[22] Filed: Nov. 10, 1977

[30] Foreign Application Priority Data

Dec. 14, 1976 [JP] Japan .................. 51-166694[U]

[51] Int. Cl.² .................. H04B 1/16; H04B 1/06; H04B 1/16
[52] U.S. Cl. .................. 325/427; 325/344; 325/490
[58] Field of Search .................. 325/387, 408, 427, 477, 325/488-490, 344

[56] References Cited

U.S. PATENT DOCUMENTS

| | | | |
|---|---|---|---|
| 3,872,387 | 3/1975 | Banach | 325/489 X |
| 3,904,968 | 9/1975 | Brinegar | 325/427 X |
| 3,991,374 | 11/1976 | Csicsatka et al. | 325/490 |
| 4,030,036 | 6/1977 | Kusano | 325/490 X |
| 4,045,740 | 8/1977 | Baker | 325/490 X |
| 4,124,817 | 11/1978 | Takahashi | 325/427 |

*Primary Examiner*—Robert L. Richardson
*Assistant Examiner*—Aristotelis M. Psitos
*Attorney, Agent, or Firm*—Fulwider, Patton, Rieber, Lee & Utecht

[57] ABSTRACT

A plurality of parallel branch paths are connected in an intermediate frequency or high frequency amplifying circuit of a radio receiver for the purpose of switching the bandwidth. Between an intermediate point of each branch path and the ground is connected output electrodes of a transistor, and the base electrode of the transistor is selectively connected to a source of control voltage via a transfer switch to render the selected transistor conductive.

1 Claim, 3 Drawing Figures

BANDWIDTH SWITCHING CIRCUITS OF RADIO RECEIVER

BACKGROUND OF THE INVENTION

This invention relates to a bandwidth switching circuit of an intermediate frequency or a high frequency amplifying circuit of a radio receiver, and more particularly a bandwidth switching circuit in which the switching is effected between differing signal paths having different pass bandwidths.

In a bandwidth switching circuit of the type referred to above, buffer amplifiers are provided for input and output parts of respective systems of a plurality of signal paths for preventing mutual interference and the amplifiers of the paths are not suitably ON.OFF-controlled so as to switch signals.

With such switching circuit, since amplifiers are provided on the input and output parts of the signal paths it is necessary to use a number of component parts for effecting switching thereby complicating the construction of the circuit. Moreover, as the amplifiers are connected in the signal paths it is necessary to use elements capable of operating at high frequencies for constituting the amplifiers, which also increases the cost of the tuner.

As above described buffer amplifiers are used for the purpose of preventing mutual interference between signal paths but since such amplifiers require a number of component parts, the buffer amplifiers can not operate effectively unless the component parts are efficiently arranged especially in view of shielding between the respective signal paths. When amplifiers are connected in respective signal paths it is necessary to adjust the amplifiers such that the gains of respective signal paths will be the same.

SUMMARY OF THE INVENTION

Accordingly, it is an object of this invention to provide simple and inexpensive bandwidth switching circuit for the intermediate frequency or high frequency amplifying circuit of a radio receiver, which can eliminate the buffer amplifier of the signal path.

Another object of this invention is to provide a novel frequency bandwidth switching circuit of a radio receiver in which it is not necessary to adjust the gains of respective signal paths when the bandwidth is switched.

According to this invention, these and further objects can be accomplished by providing a bandwidth switching circuit of a radio receiver comprising a plurality of parallel branch signal paths connected in a signal path of the radio receiver, the branch signal paths including circuit elements having different pass bandwidths, three-terminal switching elements with their output electrodes respectively connected between intermediate points of respective branch signal paths and the ground, a source of control voltage, and a transfer switch for selectively connecting the source to the input electrode of either one of the three-terminal switching elements.

The branch signal paths are connected in parallel in an intermediate frequency or high frequency amplifying circuit of the tuner and the three-terminal switching element comprises an NPN or PNP type transistor or a field effect transistor.

BRIEF DESCRIPTION OF THE DRAWINGS

In the accompanying drawings.

DETAIL DESCRIPTION OF THE PREFERRED EMBODIMENT

Figure 1:
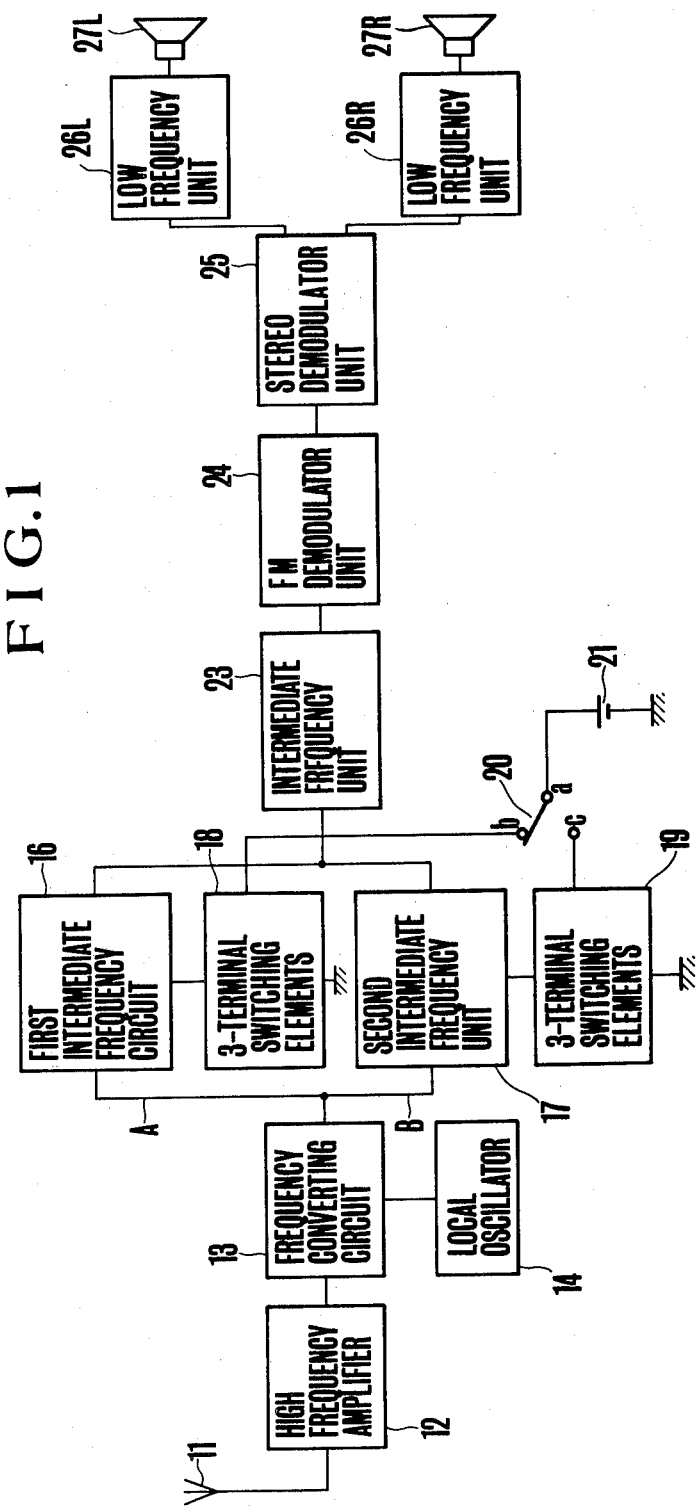
FIG. 1 is a block diagram showing one embodiment of the bandwidth switching circuit of the radio receiver embodying the invention

In the bandwidth switching circuit shown in FIG. 1 as applied to an FM radio receiver, the signal received by an antenna 11 is amplified by a high frequency amplifier 12 and is then sent to a frequency converting circuit 13 to be compared with the output of a local oscillator 14 so as to obtain an intermediate frequency signal. Up to this point, the construction of the circuit is the same as that of a well known circuit.

The circuit portion embodying the invention comprises an intermediate frequency stage following the frequency converting circuit. More particularly the intermediate frequency signal produced by the frequency converting circuit 13 is devided into two parts to pass through two parallel branched signal paths A and B, and the signals to these branch signal paths are sent to first and second intermediate frequency circuits 16 and 17 without passing through any switch. The output of these intermediate frequency circuits are commonly connected to the input of the receiving circuit also without intervention of any switch. Three-terminal switching elements 18 and 19 are connected between intermediate points of respective intermediate frequency circuits 16 and 17 and a point (ground) of a reference potential, and a control source 21 is connected to the control electrodes of these three-terminal switching elements through a transfer switch 20.

As is well known in the art, the outputs of the first and second intermediate frequency circuits 16 and 17 are connected to loudspeakers 27L and 27R or the like via an intermediate frequency unit 23 including an intermediate frequency amplifier and an amplitude limiter, an FM demodulator unit 24, a stereo demodulator unit 25, and low frequency units 26L and 26R.

Figure 2:
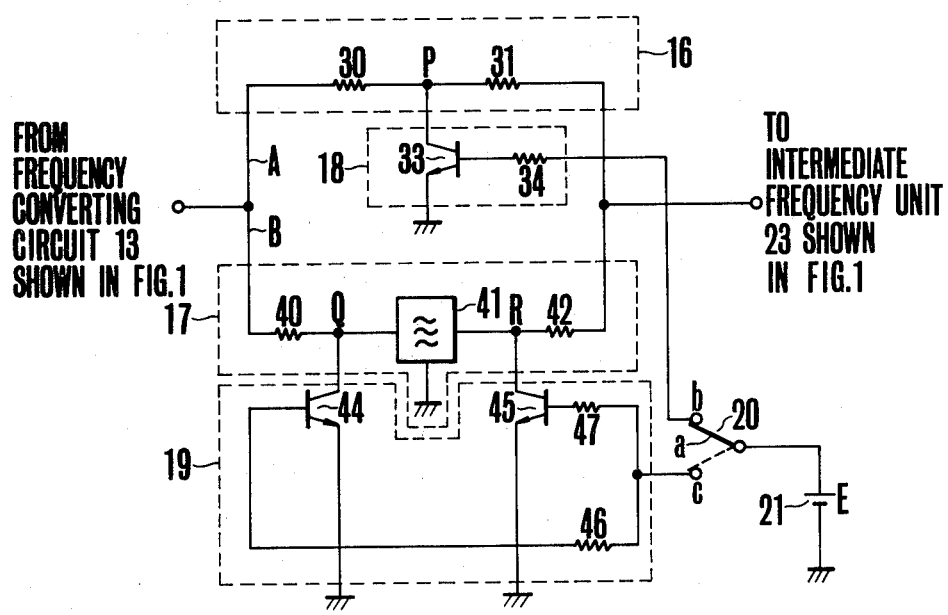
FIG. 2 is a connection diagram showing one example of the bandwidth switching circuit embodying the invention.

FIG. 2 shows one example of the bandwidth switching circuit of a radio receiver embodying the invention. As shown the first intermediate frequency circuit 16 comprises serially connected resistors 30 and 31 and the juncture P between these resistors 30, 31 are connected to the collector electrode of an NPN bipolar transistor 33 constituting a three-terminal switching element 18. The emitter electrode of transistor 33 is grounded, while the base electrode is connected to the stationary contact b of the transfer switch 20 via resistor 34.

The second intermediate frequency circuit 17 comprises a resistor 40, an intermediate frequency filter 41, and a resistor 42 which are connected in series. The juncture Q between resistor 40 and filter 41 is connected to the collector electrode of an NPN bipolar transistor 44 which constitutes a portion of the other three-terminal switching element 19, whereas the emitter electrode of transistor 44 is grounded. Similarly the juncture R between filter 41 and resistor 42 is connected to the collector electrode of an NPN bipolar transistor 45 which constitutes the other portion of the second three-terminal switching element 19, and the emitter electrode of the transistor 45 is grounded. The base electrodes of transistors 44 and 45 are connected together through resistors 46 and 47 and the juncture therebetween is connected to the stationary contact c of the transfer switch 20. The intermediate frequency filter 41 has a bandwidth of $f_0 \pm f$ where $f_0$ represents the center frequency.

Since the first branch signal path A does not contain a filter, it passes all bands of the intermediate frequency signal supplied from the frequency converting circuit 13, whereas the second branch signal path B passes a signal of narrow bandwidth among the intermediate frequency signals, the bandwidth being determined by the characteristic of the intermediate frequency filter.

Figure 3:
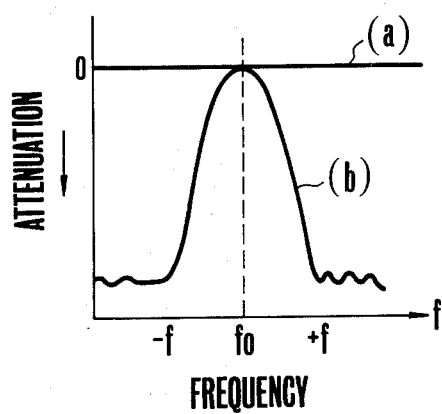
FIG. 3 shows the frequency attenuation characteristic useful to explain the operation of the bandwidth switching circuit shown in FIG. 1.

FIG. 3 shows the band characteristic, that is the attenuation characteristics of the intermediate frequency circuits 16 and 17 in which the abscissa represents frequency f, while the ordinate the attenuation by taking zero loss as a reference. In FIG. 3, curves a and b show the characteristics of the first and second intermediate frequency circuits 16 and 17 respectively.

The bandwidth switching circuit of this invention operates as follows. Where it is desired to select the first branch signal path A, the movable contact a of the transfer switch 20 is thrown to the stationary contact c thereby connecting the base electrodes of transistors 44 and 45 to the source of control voltage 21 via respective resistors 46 and 47 and the transfer switch 20. Accordingly, base currents flow to the transistors 44 and 45 thus turning ON them and the collectors, that is junctures Q and R assume the ground potential. On the other hand, since the base circuit of transistor 33 of the three-terminal switching element 18 is opened, this transistor is in the OFF state. Consequently the intermediate frequency signal sent out from the frequency converting circuit 13 is transmitted to the intermediate frequency unit 23 via the first branch signal path A, that is through the resistors 30 and 31 of the first intermediate frequency circuit 16 without varying the frequency bandwidth.

Where it is desired to select the second branch signal path B, the transfer switch 20 is thrown to the stationary contact b to connect the base electrode of transistor 33 constituting the first three-terminal switching element 18 to the source of control voltage 21 via resistor 34 and transfer switch 20. As a consequence, transistor 33 is turned ON to reduce the potential of point P to the ground potential. At this time, transistors 44 and 45 of the second three-terminal switching elements 19 are in their OFF state. Thus, the intermediate frequency signal from the frequency converting circuit 13 flows to the intermediate frequency unit 23 through the second branch signal path B, that is through resistors 40 and 42 and filter 41 of the second intermediate frequency circuit 17 so that a narrow band intermediate frequency signal having a bandwidth $f_0 \pm f$ selected by the filter 41 is supplied to the intermediate frequency unit 23 of the next stage.

In an FM radio receiver the bandwidth is selected such that the signal is attenuated 55 dB when detuned by $\pm$ 400 KHz for a wide bandwidth (in this embodiment when the first branch signal path A is selected), whereas attenuated 85dB when detuned by $\pm$ 400 KHz for a narrow bandwidth (in this embodiment when the second branch signal path B is selected).

According to this invention there are the following advantages when compared with the prior art circuit.

Thus, it is possible to simply switch the signal paths or branch signal paths with a simple circuit not using any buffer amplifier. Moreover, as the transfer switch is grounded it is possible to greatly reduce mutual interference between the signal paths. Further, since the switching circuit is used it is not only possible to reduce the cost but also to make easy the design of the printed circuit board utilized in the switching circuit. In addition, since no amplifier is used it is possible to readily match the gains of both signal paths.

Although in the embodiment described above, NPN bipolar transistors are used as the three-terminal switching elements, these transistors may be substituted by such other type switching elements as PNP transistors and field effect transistors.

In the foregoing embodiment, one branch signal path does not contain any filter so that all bandwidths of the intermediate frequency signal are transmitted whereas the other branch signal path includes a filter so as to pass a narrow bandwidth but it will be clear that the invention is also applicable to such system wherein filters having different pass bandwidths are included in respective branch signal paths.

It is also possible to apply the invention to switch high frequency bandwidth of the high frequency amplifier circuit of a radio receiver. Furthermore, the received signal may be AM (amplitude modulation) signals.

What is claimed is:

1. In an intermediate frequency stage of a bandwidth switching circuit of a radio receiver wherein an intermediate frequency signal may selectively pass through either one of two parallel branched signal paths, the improvement wherein the selection of said branched signal paths is effected by a switching operation of a transfer switch which includes two stationary contacts and a movable contact, and wherein one of said parallel branched paths comprises a first intermediate frequency circuit constituted by first and second resistors connected in series, a first three-terminal switching element constituted by a first transistor and a third resistor, the first transistor having a collector-emitter current path with one end grounded, the other end connected to the juncture between said first and second resistors, and its base electrode connected to one stationary contact of said transfer switch through our third resistor, and wherein the other of said parallel branched paths comprises a fourth resistor, an intermediate frequency filter and a fifth resistor which are connected in series, a second three terminal switching element constituted by second and third transistors and sixth and seventh resistors, one output electrode of said second transistor being connected to the juncture between the fourth resistor and the intermediate frequency filter, one output electrode of said third transistor being connected to the juncture between the intermediate frequency filter and the fifth resistor, the other output electrodes of both said second and third transistors being grounded, input electrodes of said second and third transistors being connected in common to the other stationary contact of said transfer switch through said sixth and seventh resistors, respectively, and wherein the movable contact of said transfer switch is connected to one terminal of a single d.c. voltage source, the other terminal of said source being grounded.

* * * * *

UNITED STATES PATENT AND TRADEMARK OFFICE
CERTIFICATE OF CORRECTION

PATENT NO. : 4,178,551
DATED : December 11, 1979
INVENTOR(S) : Ogita et al

It is certified that error appears in the above-identified patent and that said Letters Patent are hereby corrected as shown below:

In column 4, line 48, please change [our] to --the--.

Signed and Sealed this

Twenty-sixth Day of August 1980

[SEAL]

Attest:

SIDNEY A. DIAMOND

Attesting Officer        Commissioner of Patents and Trademarks